US012706615B2

United States Patent

Kaynak et al.

(12) United States Patent
(10) Patent No.: US 12,706,615 B2
(45) Date of Patent: Aug. 11, 2026

(54) ITERATIVE ERROR DECODING WITH EARLY TERMINATION OF DECODING PROCESS

(71) Applicant: MICRON TECHNOLOGY, INC., Boise, ID (US)

(72) Inventors: Mustafa N. Kaynak, San Diego, CA (US); Sivagnanam Parthasarathy, Carlsbad, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 28 days.

(21) Appl. No.: 18/784,646

(22) Filed: Jul. 25, 2024

(65) Prior Publication Data

US 2026/0031835 A1 Jan. 29, 2026

(51) Int. Cl.

*H03M 13/11* (2006.01)
*H03M 13/25* (2006.01)
*H03M 13/29* (2006.01)

(52) U.S. Cl.

CPC ..... *H03M 13/1125* (2013.01); *H03M 13/255* (2013.01); *H03M 13/2948* (2013.01)

(58) Field of Classification Search

None

See application file for complete search history.

(56) References Cited

U.S. PATENT DOCUMENTS

2014/0164868 A1* 6/2014 Haratsch ................ G11C 29/52 714/763
2018/0343082 A1* 11/2018 Xiong .................. H04L 1/0057

* cited by examiner

*Primary Examiner* — Guerrier Merant

(74) *Attorney, Agent, or Firm* — Tarolli, Sundheim, Covell & Tummino LLP

(57) ABSTRACT

A method for decoding data is disclosed. The method includes determining that a codeword received from a memory device has errors and initiating a soft decoding process to decode embedded data from the codeword based on assigning respective LLR values to bits of the codeword and based on updating LLR values of the bits at each iteration of the soft decoding process. The method also includes incrementing an iteration counter at each iteration of the soft decoding process and determining that the soft decoding process will be unable to decode the embedded data before the iteration counter achieves a maximum iteration count based on the updated LLR values of the bits. The method further includes terminating the soft decoding process at an iteration count that is less than the maximum iteration count in response to the determination that the soft decoding process will be unable to decode the embedded data.

16 Claims, 6 Drawing Sheets

ITERATIVE ERROR DECODING WITH EARLY TERMINATION OF DECODING PROCESS

TECHNICAL FIELD

This disclosure relates to decoding to correct errors in data, and particularly to iterative error decoding with early termination of decoding process.

BACKGROUND

A memory sub-system includes a memory device designed for data storage. These memory devices are implemented as non-volatile and volatile memory devices in various examples. In some such examples, a host system employs a memory sub-system for the purposes of storing data on the memory devices and for retrieving data from the memory devices. In certain circumstances, data retrieved from memory has errors that can be corrected by error encoding and decoding techniques. Soft decoding is a type of error-correcting decoding utilized in memory correction that implements an error correction code that characterizes a reliability of determined bit values of data transmitted over communication channels with high efficiency and reliability.

DETAILED DESCRIPTION

Figure 1A:
FIG. 1A illustrates system for decoding data from a memory sub-system.
Figure 1A:
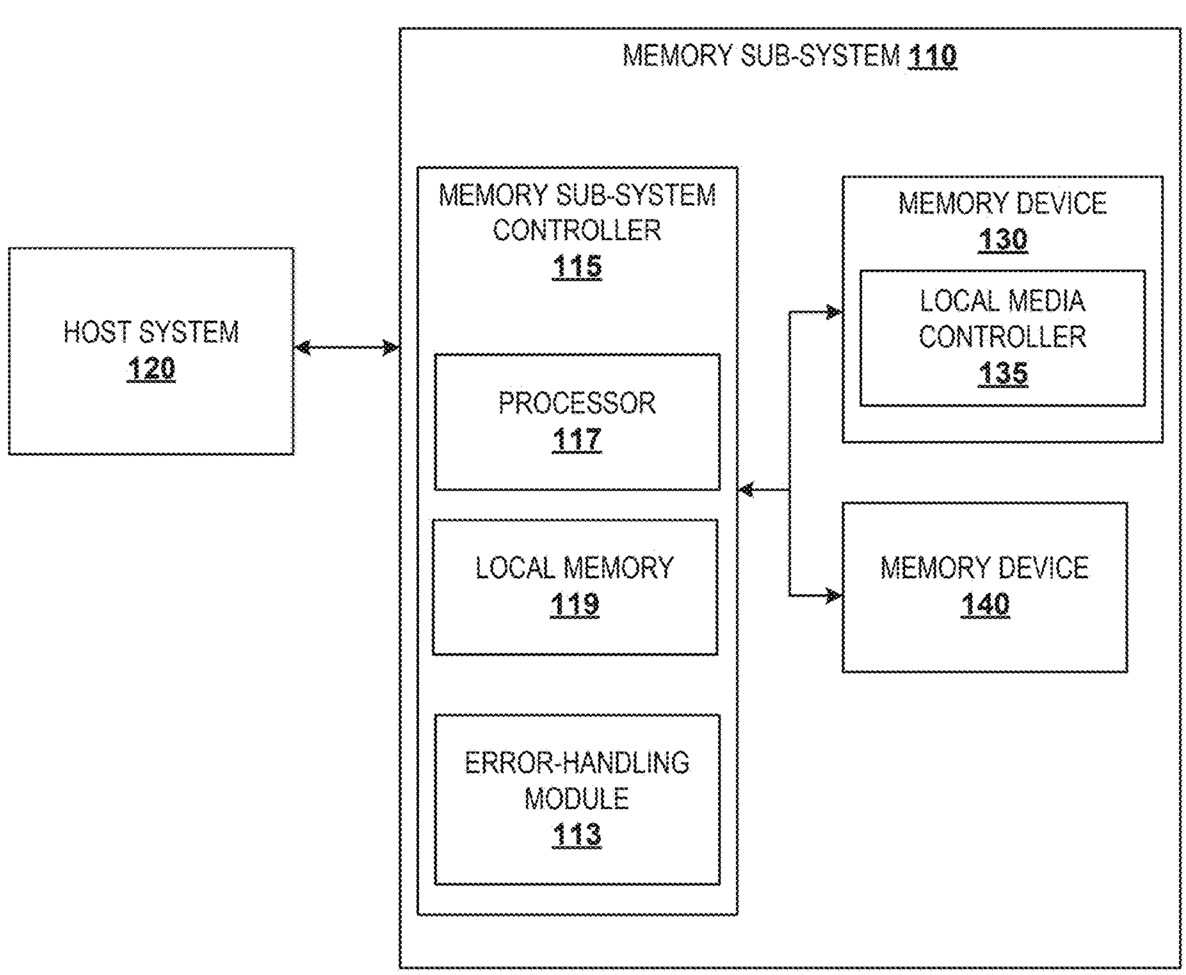

This disclosure relates to decoding to correct errors in data, and particularly to iterative error decoding with early termination of decoding process. The error decoding described herein provides adaptive error-handling to curtail an impact of a wide range of high-reliability error rates (HRERs) on soft decoding algorithms, such as low density parity-check (LDPC) codes. HRER refers to a rate of erroneous bits that are assigned a high reliability based on a soft read process performed on data stored in a memory. The decoding process described herein implements error correction using a plurality of iterative soft decoding processes that each use a different log-likelihood ratio (LLR) set. The different LLR sets can be optimized for different HRERs. For example, in the event of failure of a first soft decoding process to decode a codeword using a first LLR set, the decoder can implement a second soft decoding process to decode the codeword using a second LLR set that is different from the first LLR set (e.g., is optimized for a higher HRER). Iterative soft decoding processes can provide changes to reliability values of each of the bits in each iteration, up to a maximum iteration count determined by an iteration counter. To save computational time, as described herein, the decoder can detect if a given soft decoding process will be unable to decode the codeword before the maximum iteration count based on the reliability values of the bits of the codeword, and can terminate the soft decoding process before the iteration counter reaches the maximum iteration count.

A memory sub-system refers to a storage device, a memory module or some combination thereof. The memory sub-system includes a memory device or multiple memory devices that store data. The memory devices could be volatile or non-volatile memory devices. Some examples of a memory sub-system include high density non-volatile memory devices where retention of data is desired during intervals of time where no power is supplied to the memory device. One example of a non-volatile memory device is a not-AND (NAND) memory device. A non-volatile memory device is a package that includes a die(s). Each such die can include a plane(s). For some types of non-volatile memory devices (e.g., NAND memory devices), each plane includes a set of physical blocks, and each physical block includes a set of pages. Each page includes a set of memory cells, which are commonly referred to as cells. A cell is an electronic circuit that stores information. A cell stores at least one bit of binary information and has various logic states that correlate to the number of bits being stored. The logic states are be represented by binary values, such as '0' and '1', or as combinations of such values, such as '00', '01', '10' and '11'.

A memory device includes multiple cells arranged in a two-dimensional or a three-dimensional array. In some examples, memory cells are formed on a silicon wafer in an array of columns connected by conductive lines (also referred to as bitlines, or BLs) and rows connected by conductive lines (also referred to as wordlines or WLs). A wordline is a row of associated memory cells in a memory device that are used with a bitline or multiple bitlines to generate the address of each of the memory cells. The intersection of a bitline and a wordline defines an address of a given memory cell.

A block refers to a unit of the memory device used to store data. In various examples, the unit could be implemented as a group of memory cells, a wordline group, a wordline or as individual memory cells. Multiple blocks are grouped together to form separate partitions (e.g., planes) of the memory device to enable concurrent operations to take place on each plane. A solid-state drive (SSD) is an example of a memory sub-system that includes a non-volatile memory device(s) and a memory sub-system controller to manage the non-volatile memory devices.

The memory sub-system controller is configured/programmed to encode the host and other data, as part of a write operation, into a format for storage at the memory device(s). Encoding refers to a process of generating parity bits from embedded data (e.g., a sequence of binary bits) using an error correction code (ECC) and combining the parity bits to the embedded data to generate a codeword. As described in greater detail herein, the term "soft" refers to a probability or reliability of a value of a given bit, and can be defined by one or more soft bits.

One example of soft information usage is in decoding for memory that utilizes LDPC. As example, an LDPC code is defined by, among other things, a sparse parity-check matrix, alternatively referred to as an H matrix, denoted as H. Each row of the H matrix embodies a linear constraint imposed on a designated subset of data bits. Entries within the H matrix, either '0' or '1', signify the participation of individual data bits in each constraint. Stated differently, each row of the H matrix represents a parity-check equation, and each column corresponds to a bit in the codeword. During encoding, the embedded data is multiplied by the generator matrix, which is the inverse of the H matrix associated with a chosen LDPC code, to generate parity bits. The generated parity bits are appended to the embedded data to generate an LDPC codeword. The LDPC codeword includes the embedded data and the parity bits, allowing for identification and rectification of errors. The LDPC codeword is storable at the memory device(s) of the memory sub-system.

Additionally, the memory sub-system controller can decode codewords, as part of a read operation, stored at the memory device(s) of the memory sub-system. Decoding refers to a process of reconstructing the original embedded data (e.g., sequence of binary bits) from the codeword (e.g., the encoded original embedded data) received from storage at the memory device(s). LDPC decoding refers to a decoding method that utilizes the LDPC code to reconstruct the original embedded data.

Initially, during LDPC decoding, the LDPC codeword is compared with the expected relationships encoded in the H matrix. In particular, the LDPC codeword is multiplied by a transpose of the H matrix associated with the LDPC code used to encode the LDPC codeword. This operation can also be performed without making a matrix multiplication by sequentially checking each parity using XOR operations. The result of the multiplication produces a vector (e.g., a syndrome vector), in which each element corresponds to a specific parity-check equation in the sparse parity-check matrix. The number of non-zero entries in the syndrome vector corresponds to the non-satisfied (e.g., failed) parity checks, and the number of non-satisfied parity checks is the syndrome weight. A syndrome vector with zero values signifies that the corresponding parity-check equation is satisfied (e.g., no errors or having even number of bit errors in the parity check equation), and a syndrome vector with non-zero values indicates potential errors impacting the bits involved in the corresponding parity-check equation. Potential errors, for example, may be due to the bits involved in the corresponding parity-check equation being flipped due to noise, interference, distortion, bit synchronization errors or errors from the media itself (both intrinsic and extrinsic). For example, a bit that may have originally been stored as a '0' may be flipped to a '1' or vice versa.

In response to detection of the potential errors, an algorithm of the LDPC decoding, such as a MinSum (alternatively referred to as min-sum) algorithm, iteratively analyzes the LDPC codeword and estimates the most likely values for the data bits. In particular, the algorithm of the LDPC decoding (e.g., decoding algorithm) is initialized with either hard decisions and/or soft decisions of the LDPC codeword. Hard decisions refer to binary decisions made about the LDPC codeword, where each bit is classified as either '0' or '1' based on a threshold. Soft decisions refer a likelihood or confidence score indicating how likely each bit is to be classified as either '0' or '1'. In some instances, soft decisions may be represented as a log-likelihood ratio (LLR) set, in which each LLR of the LLR set is a value that indicates a likelihood or confidence score of a bit of the LDPC codeword to be classified as either '0' or '1'. The LLR is a ratio of the probabilities of receiving a particular signal given the bit is '0' versus the bit being '1' or vice versa. A positive LLR (e.g., a positive value) indicates that '0' is a more likely decision, whereas a negative LLR (e.g., a negative value) indicates that '1' is a more likely decision. The magnitude of the LLR indicates the confidence in this decision. A higher magnitude (or larger value) suggests higher confidence in the decision.

Subsequent to initializing the decoding algorithm with either hard decisions or soft decisions of the LDPC codeword, the decoding algorithm, using a tanner graph, iteratively exchanges messages within the tanner graph. The tanner graph refers to a bipartite graph representation of the H matrix of the LDPC code. The tanner graph includes two types of nodes (i) variable nodes (representing the bits of the codeword) and (ii) check nodes (representing the parity-check equations). Each check node is connected to several variable nodes. The decoding algorithm iteratively exchanges messages within the tanner graph by iteratively exchanging messages between variable nodes and check nodes.

With respect to the decoding algorithm initialized with hard and/or soft information, during each iteration of the decoding process, each check node computes and sends a message to each connected variable node based on the reliability (soft) information check node received from variable nodes. The message reflects the likelihood of that a particular bit satisfies the corresponding parity-check equation, given the current estimates of the other bits, based on the initialized hard/soft decisions, involved in that particular parity check. Each connected variable node, based on the message computed by the corresponding check node, and each connected variable node updates its estimate, (e.g., the LLR for the corresponding variable node). For example, the update can include increasing the estimate of a reliability value of the variable node (e.g., "rewarding" the LLR value) in response to a passed parity check, and can include decreasing the estimate of the reliability value of the variable node (e.g., "penalizing" the LLR value) in response to a failed parity check. Each connected variable node sends back an updated message to the check node, which influences the next message from the check node. This iterative process gradually refines the estimates of the likelihood for each bit, aiming to converge to a consistent set of values that satisfy all parity-check equations (syndrome weight=0) of the H matrix of the LDPC code or until a maximum number of iterations of the decoding process is reached. The use of soft decisions in the decoding algorithm results in more accurate decoding, such as to provide an increased reliability of the error-correction capability, and thus a higher error rate that can be corrected by LDPC.

Codeword error rate (CWER) refers to a metric used to quantify a correction capability of the decoding algorithm. Stated differently, CWER reflects the number of codewords out of a collection of codewords that have at least one bit error after the decoding process. A lower CWER implies better decoding performance and higher reliability, while a higher CWER suggests that the algorithm may struggle to effectively correct errors. With respect to using hard information with the decoding algorithm, CWER is functionally dependent on the raw-bit-error-rate (RBER), which is a raw measure of errors occurring in the absence of any correction.

With respect to using soft information with the decoding algorithm, CWER is functionally dependent on the RBER and a high reliability error rate (HRER), which measures the reliability of bits marked as "highly reliable" by the soft input. More specifically, HRER quantifies the error rate among bits identified as "highly reliable" based on soft information. Accordingly, for a given RBER, an increase in the HRER leads to an increase in the CWER. This relationship suggests that when more errors are falsely assigned high reliability values, it becomes more challenging for the decoding algorithm to correctly reconstruct the original codewords, thus leading to a higher CWER.

In addition to the LDPC decoding process described herein, data errors can also be recovered by the memory sub-system controller via redundant array of independent NAND (RAIN) recovery. In RAIN recovery, bit-wise data of each of different sets of data is provided to an XOR logic operation to provide a respective RAIN parity bit. RAIN recovery is typically implemented to recover data that is lost from die failure or other types of data losses. For example, each bit from each of different data sources (e.g., dies, rows of a memory array, codewords, etc.) can be aggregated in an XOR logic operation in a bit-wise manner to provide the corresponding RAIN parity bit. The data bits that are aggregated in the XOR logic operation to generate a single RAIN parity bit is referred to hereinafter as a "RAIN stripe." Therefore, by evaluating the RAIN parity bits, data that is lost from one of the data sources can be recovered based on the value of the RAIN parity bits.

As an example, the memory sub-system controller can implement a plurality of different LLR sets in the soft decoding process, such as to accommodate a codewords having a higher HRER. Therefore, the soft decoding process can provide for a more robust data error correction. As described hereinafter, the term "soft decoding process" can refer to any decoding process which uses soft information, such as a standard soft decoding process (e.g., that implements LDPC) or any variations thereof that implements soft bits for decoding a codeword.

To initiate the decoding process, the memory sub-system controller receives a codeword sent over a communication channel. The memory sub-system controller calculates a syndrome vector which indicates that the codeword includes errors. As an example, some LLR sets can operate more effectively in LDPC decoding across a certain range of HRER of codewords, but the same LLR sets can operate less effectively for a different range HRER. For example, some LLR sets operate more effectively in LDPC decoding for codewords having higher HRER, but less effectively for codewords having lower HRER.

To mitigate the impact of HRER in LDPC codes, the memory sub-system controller described herein can implement multiple decoding processes (e.g., multiple soft decoding processes) that utilize different LLR sets from which LLR values are assigned to bits of the codeword. The examples described below refer to a first LLR set and a second LLR set that can be or can be included in the different LLR sets. Therefore, as described herein, the memory sub-system controller implement two or more decoding processes with a respective two or more LLR sets, and is not limited to two LLR sets.

For example, the memory sub-system controller can implement a first soft decoding process based on a first LLR set. The first LLR set implemented by the first soft decoding process can have LLR values that are optimized to decode a codeword having a first range of HRER values. As an example, the first range of HRER values can correspond to an average HRER of the memory device. In response to determining failure of the first soft decoding process based on the first LLR set, the memory sub-system controller can implement a second soft decoding process based on a second LLR set. The second LLR set implemented by the second soft decoding process can have LLR values that are optimized to decode a codeword having a second range of HRER values, with at least a portion of the second range having greater values than the first range. As an example, the second range of HRER values can correspond to a higher HRER of the memory device.

As described herein, the term "average HRER" can correspond to a first range of values of HRER that is relatively lower, and can thus correspond to a broad range of RBER of codewords up to a certain value of HRER. Therefore, the first LLR set can be optimized to decode codewords having a larger variety of different RBERs, thereby providing a high likelihood of successful decoding of any given codeword. However, as described above, some LLR sets are less effective for decoding codewords having higher HRER values, and some LLR sets are more effective for decoding codewords having higher HRER values while being less effective at decoding codewords having lower HRER values. Therefore, in response to failure of the first soft decoding process that implements the first LLR set, the memory sub-system controller can implement a second soft decoding process that implements the second LLR set that is more effective for decoding codewords having higher HRER values. Therefore, the decoder can exhibit an enhanced ability to correct errors with soft RAIN recovery under varying conditions, particularly in scenarios with higher HRER values. The first and second LLR sets can be optimized/determined based on analysis of NAND under various stress conditions.

As described above, a soft decoding process of a codeword is an iterative process that implements an iteration counter. In each iteration, the LLR values assigned to the bits of the codeword are updated based on the results of parity checks of check nodes. For example, the update can include increasing the LLR values assigned to the bits, thereby increasing an estimate of reliability of the respective node (e.g., "rewarding" the LLR value), in response to a passed (satisfied) parity check. Similarly, the update can include decreasing the LLR values assigned to the bits, thereby decreasing an estimate of reliability of the respective node (e.g., "penalizing" the LLR value) in response to a failed (non-satisfied) parity check. In response to LLR values decreasing to a sign change (e.g., an LLR absolute value decreasing less than zero), the respective bit of the codeword is flipped in binary value at the conclusion of the respective iteration.

Therefore, the collective reliability of the bits of the codeword, as provided by the updated LLR values, should eventually converge to sufficient reliability to pass all parity checks at each check node, resulting in a successful decoding process. Therefore, the iterative operation of the soft decoding process can repeat until either all of the parity checks succeed, at which the codeword is successfully decoded to obtain the embedded data, or the number of iterations of the soft decoding process reaches a maximum iteration count, at which the soft decoding process is terminated. In the example of termination of the soft decoding process, the collective reliability of the bits of the codeword, as provided by the updated LLR values, did not converge to a sufficient reliability to pass all parity checks at each check node. Termination of the soft decoding process is also referred to herein as failure of the soft decoding process to decode the codeword.

As also described above, in response to determining failure of a first soft decoding process to decode the codeword based on the first LLR set, the memory sub-system controller can implement a second soft decoding process to decode the codeword based on the second LLR set. In some examples, the iterative first soft decoding process therefore is unable to decode the codeword before the iteration count of an iteration counter reaches a predefined maximum iteration count that corresponds to timeout, and therefore termination, of the first soft decoding process. In this respective example, the memory sub-system controller can then switch to the second soft decoding process to attempt to decode the codeword within an iteration count of less than the predefined maximum iteration count. Accordingly, in this respective example, the memory sub-system controller only terminates a given soft decoding process in response to the iteration count of the given soft decoding process achieving the predefined maximum iteration count.

Repeatedly stepping through each iteration of the soft decoding process to a maximum iteration count for each codeword that is uncorrectable with a given LLR set before switching to a next LLR set can take a significant amount of time to access encoded data. Because a constant goal of computing is increased rapidity (e.g., lower decoding latency), the significant amount of time to access encoded data, as resulting from requiring the iteration count achieving the predefined maximum, can counteract the goal of greater computational speed. Therefore, the benefit of more effective error correction by implementing multiple soft decoding processes with different LLR sets can be detrimentally offset by a decrease in computational speed.

To provide for greater computational speed and efficiency (e.g., lower decoding latency), the memory sub-system controller described herein can be configured to monitor the updated LLR values of the bits of the codeword during the iterative soft decoding process to determine if the soft decoding process is able to decode the embedded data before the iteration counter achieves the predefined maximum iteration count. If the memory sub-system controller determines that the soft decoding process will be unable to decode the embedded data before the iteration counter achieves the predefined maximum iteration count, the memory sub-system controller can terminate the soft decoding process before the iteration count reaches the predefined maximum iteration count. The memory sub-system controller can then switch to a next soft decoding process using a different LLR set sooner than if the iteration count reached the predefined maximum. Accordingly, the memory sub-system controller described herein can provide for more efficient decoding by being able to more rapidly determine failure of a given soft decoding process before switching to another potentially more effective soft decoding process.

FIG. 1A illustrates a system 100 that includes a memory sub-system 110 that can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card and a hard disk drive (HDD). Examples of memory modules include a dual in-line memory module (DIMM), a small outline DIMM (SO-DIMM) and various types of non-volatile dual in-line memory modules (NVDIMMs).

The system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment or a networked commercial device) or such computing device that includes memory and a processing device. The system 100 can include a host system 120 that is coupled to one or more memory sub-systems 110. In some examples, the host system 120 is coupled to different types of the memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller, CXL controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a compute express link (CXL) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory device(s) 130) when the memory sub-system 110 is coupled with the host system 120 by the physical host interface (e.g., PCIe or CXL bus). The physical host interface can provide an interface for passing control, address, data and other signals between the memory sub-system 110 and the host system 120. FIG. 1A illustrates a memory sub-system 110 as an example. In general, the host system 120 can access multiple memory sub-systems via a same communication connection, multiple separate communication connections and/or a combination of communication connections.

The memory device 130 and the memory device 140 are implemented as non-transitory computer readable media. The memory device 130 and the memory device 140 can include any combination of the different types of non-volatile memory devices and/or volatile memory devices. The volatile memory devices (e.g., the memory device 140) can be, but are not limited to, random access memory (RAM), such as dynamic random access memory (DRAM) and synchronous dynamic random access memory (SDRAM).

Some examples of non-volatile memory devices (e.g., memory device(s) 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory device(s) 130 include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) or higher, can store multiple bits per cell. In some examples, each of the memory devices 130 can include one or more arrays of memory cells such as SLCs, MLCs, TLCs, QLCs or some combination thereof. In some examples, a particular memory device can include an SLC portion, an MLC portion, a TLC portion and/or a QLC portion of memory cells. The memory cells of the memory devices 130 can be grouped as pages that can refer to a logical unit of the memory device used to store data. In some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide-based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM), etc.

A memory sub-system controller 115 (or controller 115 for simplicity) communicates with the memory device(s) 130 to perform operations such as reading data, writing data or erasing data at the memory devices 130 and other such operations. The memory sub-system controller 115 can include hardware such as one or more integrated circuits and/or discrete components, a buffer memory or some combination thereof. The hardware can include a digital circuitry with dedicated (e.g., hard-coded) logic to perform the operations described herein. The memory sub-system controller 115 can be a microcontroller, special purpose logic circuitry (e.g., a field programmable gate array (FPGA), an application specific integrated circuit (ASIC), etc.) or another suitable processor.

The memory sub-system controller 115 can include a processing device, which includes one or more processors (e.g., the processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120. The local memory 119 is a non-transitory computer-readable medium.

In some examples, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another example, a memory sub-system 110 does not include a memory sub-system controller 115 and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations and address translations between a logical address (e.g., a logical block address (LBA), namespace) and a physical address (e.g., physical block address) that are associated with the memory devices 130. The memory sub-system controller 115, for example, may employ a Flash Translation Layer (FTL) to translate logical addresses to corresponding physical memory addresses, which can be stored in one or more FTL mapping tables. In some instances, the FTL mapping table can be referred to as a logical-to-physical (L2P) mapping table storing L2P mapping information. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. For example, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some examples, the memory devices 130 include local media controllers 135 that operate in concert with the memory sub-system controller 115 to execute operations on one or more memory cells of the memory devices 130. An external controller (e.g., the memory sub-system controller 115) can externally manage the memory device 130 (e.g., perform media management operations on the memory device 130). In some examples, the memory sub-system 110 is a managed memory device, which is a raw memory device 130 having control logic (e.g., local media controller 135) on the die and a controller (e.g., the memory sub-system controller 115) for media management within the same memory device package. An example of a managed memory device is a managed NAND (MNAND) device.

In various examples, the memory sub-system 110 includes an error-handling module 113 that tries to execute a decoding algorithm with various combinations of log-likelihood ratio (LLR) sets to compensate for HRER and a range of CW in the H matrix of the soft code, such as an LDPC code. In some examples, the memory sub-system controller 115 includes at least a portion of the error-handling module 113. In some examples, the error-handling module 113 is part of the host system 120, an application or an operating system. In other examples, local media controller 135 includes a portion of the error-handling module 113 and is configured to perform the functionality described herein.

In operation, the host system 120 manages and controls the flow of data between itself and the memory sub-system 110, ensuring efficient data storage and retrieval operations. More generally, the host system 120 employs the memory sub-system 110 to write data to and read data from the memory sub-system 110. For instance, the host system 120 processes these request for reading and/or write data by interacting with the memory sub-system 110, managing the flow of data to and from the memory device 130 and/or the memory device 140 within the memory sub-system 110. This reading and writing of data enables operation of computing systems where data access and management is needed.

Continuing with examples of operation, the host system 120 can output a read memory command to the memory sub-system controller 115. In response, the memory sub-system controller 115 can operate in concert with the local media controller 135 to read memory cells of the memory device 130 and/or the memory device 140. The memory sub-system controller 115 can store retrieved data in the form of codewords (e.g., LDPC codewords formed of a combination of embedded data and parity bits) in the local memory 119. It is presumed that the data that is read from the memory device 130 and the memory device 140 includes hard reads (1H) and soft reads (1H2S). A soft read (1H2S) is a combination of a hard bit (1H) and two soft bits (2S). In addition, for soft information, the reads can be coarser in granularity, such as 1H1S, or finer in granularity, such as 1HNS where N is greater than two. For example, in the "1HNS" notation, N refers to the number of additional NAND page soft reads provided in addition to the hard read to extract soft information. Higher values of N result in finer granularity of the soft information, as well as longer read times.

The "hard bit" in this context is a binary read of data where each bit is read and immediately interpreted as either a '0' or a '1', based on a fixed threshold. For example, in NAND flash memory, a voltage level above a certain threshold voltage ($V_t$) might be interpreted as '0', and below that threshold as '1'. Hard reads are quick and require less computational power but provide less information about the reliability of the read bit. The "soft bits" provide additional information about the probability or confidence level of the bit being a '0' or '1'. In the present description, the confidence level of the bit is represented in terms of likelihoods or probabilities, which can be converted into an LLR set for use in decoding algorithms. Soft reads (e.g., 1H2S) are employable in error correction because soft reads (1H2S) allow a decoder algorithm of the error-handling module 113 to make more informed decisions based on the degree of certainty about each bit's state. The combination of 1H2S forming the soft read is effective in systems where both speed and data integrity are considered. The hard read forming the hard bit (1H) provides a quick initial assessment of each bit, and the soft bits offer deeper insights into the potential errors, enhancing the error correction capability of the decoder algorithm of the error-handling module 113. Furthermore, soft reads (1H2S) provide an indication of reliability of each bit. In the present example of 1H2S, it is presumed that the reliability is one of three levels: low, medium, and high, but in other examples, more or fewer levels can be employed.

As noted, codeword error rate (CWER) measures the ability of the decoding algorithm to correct errors, indicating the proportion of codewords with errors post-decoding. A lower CWER signifies better performance and reliability. For hard information, CWER depends on the raw-bit-error-rate (RBER), a basic error measure without correction. For soft reads (1H2S), CWER also relies on the high reliability error rate (HRER), which assesses the error rate among bits deemed "highly reliable." An increase in HRER, indicating more errors wrongly marked as reliable, complicates error correction, raising the CWER. As one example, suppose that RBER is 1% and the HRER is 0.1%, the HRER/RBER ratio would be 10%. Conversely, in a situation where the RBER is 1% but HRER is 0.3% (an increase of 0.2%), the HRER/RBER ratio would be 30%. In this example, CWER for HRER/RBER=10% will be lower than CWER for HRER/RBER=30% even though RBER is the same for both cases.

Continuing with the example, the error-handling module 113 can parse the codewords in the local memory 119 to detect and correct bit errors. In one example, the error-handling module 113 detects that a codeword (e.g., LDPC codeword) read from memory device 130 and/or the memory device 140 contains bit errors. To detect errors, the error-handling module 113 can multiply a transverse of the H matrix of the code (e.g., LDPC code) with the codeword to provide a syndrome vector. This operation can also be performed without a matrix multiplication by sequentially checking each parity using XOR operations. If the syndrome vector is non-zero, there is at least one error in the codeword. Moreover, the values of the non-zero syndrome vector are employable to identify check nodes of the code that have failed parity checks.

The error-handling module 113 generates a decoding parameter to be employed in performing a decoding algorithm. The decoding parameter is a particular codeword LLR, in which the error-handling module 113 assigns an LLR set from the LLR array to each bit of the codeword. As described herein, the LLR sets can each include different integer values that are mapped to specific reliabilities. The particular values can be based for example, on different values or ranges of values of HRER of codewords in the memory device. Table 1 provides an example of an LLR set that correlates a soft read (1H2S) bit value and reliability with a particular LLR value.

TABLE 1

| Bit Value | Reliability | LLR Value |
|---|---|---|
| 1 | High | −15 |
| 1 | Medium | −10 |
| 1 | Low | −5 |
| 0 | Low | 5 |
| 0 | Medium | 10 |
| 0 | High | 15 |

It is noted that the particular values for the LLR set defined in Table 1 can correspond to LLR values that are optimized for an average HRER, and can thus be optimized to decode a broad range of codewords.

As an example, each variable node (corresponding to a bit in the codeword) is initialized with the corresponding LLR set of the codeword LLR, referred to as initial LLR values denoted as $L_{INIT}$. These initial LLR values are employed in an iterative process, exchanging messages between variable nodes and associated check nodes. For example, if a variable node V is connected to three check nodes C1, C2 and C3, messages mC1→V, mC2→V and mC3→V (e.g., each mC1 . . . mC3 representing the message that is passed from check node to variable node) would be computed based on existing LLRs and specific rules.

As an example, the error-handling module 113 can employ a MinSum decoder, which is alternatively referred to as a min-sum decoder. The MinSum decoder is a streamlined decoding algorithm used with codes (e.g., LDPC codes), offering a computationally efficient alternative to the more complex Belief Propagation (BP) algorithm. The MinSum decoder operates by iteratively passing messages between variable nodes (representing codeword bits) and check nodes (representing parity checks) within a Tanner graph of the code. The MinSum decoder implements an iterative error correction process that employs two specific values, min1 and min2. During each iteration of the decoding process, the decoder of the error-handling module 113 operates through a series of message exchanges between the variable nodes and check nodes. Each check node receives messages from connected variable nodes, which contain information about the LLRs of bit values. The check node determines whether the parity condition represents by the check node is satisfied based on these incoming messages.

To update the messages sent back to the variable nodes, the MinSum decoder calculates the two smallest absolute values (min1 and min2) among the incoming messages at each check node. Mini is the smallest absolute value and min2 is the second smallest. Responsive to determining min1 and min2, the check node updates the outgoing message based on min1 and min2. If a parity check fails, indicating that there is an inconsistency among the bits involved in that check, the check node sends back messages that adjust (e.g., penalize) the reliability values of the connected variable nodes. Specifically, the variable node associated with min1 (the least reliable node based on the incoming messages) receives an update influenced by min2, and every other variable node connected to the check node receives an update influenced by min1. Thus, the MinSum decoder ensures that the least reliable bit is given the most significant adjustment, pushing the least reliable bit towards correction in subsequent iterations of the decoding process. Scalar values and offset values can be applied to the MinSum decoder to more closely approximate the operation of a decoder that employs the BP algorithm.

As an example, an example, consider a situation where a scalar value denoted as 's' and offset value denoted as 'o', mC1→V=s*min1(or min 2)+o where min1 and min2 correspond to smallest/second smallest LLR to check node CL. After the first iteration, the LLR for V would be updated using the formula and the set of decoding parameters (e.g., $L_{NEW}$ ($L_{INIT}$)+mC1→V+mC2→V+mC3→V; where $L_{INIT}$ corresponds to the initial assigned LLR value). The process is then repeated for a set number of iterations or until certain conditions are met, using the updated $L_{NEW}$ as the starting point for the next round. Finally, a hard decision is made based on the resulting $L_{FINAL}$; if $L_{FINAL}>0$, the bit is decoded as '1', and if $L_{FINAL}<0$, it is decoded as '0'. Accordingly, if the LLR of a given bit is changed from positive to negative through an iteration, the bit is flipped from '0' to '1'. Conversely, if the LLR of a given bit is changed from negative to positive through an iteration, the given bit is flipped from '1' to '0'. This iterative mechanism allows for more effective error correction by continually updating the LLRs.

The soft decoding processes described hereinafter are referred to as LDPC decoding, respectively. However, LDPC is utilized in one example of soft decoding processes, and the principles described herein can be applicable to other types of encoding and decoding processes. As described herein, to decode a given codeword, the error-handling module 113 can implement a first soft decoding process that implements a first LLR set. The first LLR set can, as an example, be optimized for decoding an average HRER of codewords. As an example, the first LLR set can correspond to the LLR set of Table 1. In response to a determination that the first soft decoding process fails, the error-handling module 113 can then implement a second soft decoding process, in which the second soft implements a second LLR set. The second LLR set can, as an example, be optimized for decoding codewords having a high HRER. Table 2 provides an example of a second LLR set (relative to the LLR set demonstrated in Table 1 that can correspond to a first LLR set) that correlates a soft read (1H2S) bit value and reliability with a particular LLR value.

TABLE 2

| Bit Value | Reliability | LLR Value |
|---|---|---|
| 1 | High | −13 |
| 1 | Medium | −10 |
| 1 | Low | −7 |
| 0 | Low | 7 |
| 0 | Medium | 10 |
| 0 | High | 13 |

The LLR values of the second LLR set demonstrated in Table 2 can, for example, be optimized for decoding codewords having a high HRER (e.g., relative to a first LLR set). Table 2 is demonstrated by example only, such that any given LLR set implemented for LDPC decoding and/or other types of soft decoding (e.g., including the first and second LLR sets demonstrated respectively in Tables 2 and 3) can be defined as having any of a variety of values.

Therefore, as described herein, implementing a plurality of soft decoding processes with different respective LLR sets can provide an additional data recovery process beyond a conventional soft decoding process. As one example, the error-handling module 113 can continue implementing subsequent soft decoding processes, each implementing different LLR sets, in response to subsequent failures. Therefore, the error-handling module 113 is not limited to two soft decoding processes. As another example, the error-handling module 113 can implement a predefined number of soft decoding processes and, in response to repeated failures to decode the codeword, can time-out and mark the codeword as uncorrectable.

As described above, soft decoding processes are iterative processes that implement an iteration counter. The LLR values assigned to the bits of the codeword can thus be updated based on the results of parity checks of check nodes in each iteration. For example, the update can include increasing the LLR values assigned to the bits, thereby increasing an estimate of reliability of the respective node (e.g., "rewarding" the LLR value), in response to a passed parity check. Similarly, the update can include decreasing the LLR values assigned to the bits, thereby decreasing an estimate of reliability of the respective node (e.g., "penalizing" the LLR value) in response to a failed parity check. In response to LLR values decreasing to a sign change (e.g., an LLR absolute value decreasing less than zero), the respective bit of the codeword is flipped in binary value at the conclusion of the respective iteration.

Therefore, the collective reliability of the bits of the codeword, as provided by the updated LLR values, should eventually converge to sufficient reliability to pass all parity checks at each check node, resulting in a successful decoding process. Therefore, the iterative operation of the soft decoding process can repeat until either all of the parity checks succeed, at which the codeword is successfully decoded to obtain the embedded data, or the number of iterations of the soft decoding process reaches a maximum iteration count, at which the soft decoding process fails, and is thus terminated. In the example of termination of the soft decoding process, the collective reliability of the bits of the codeword, as provided by the updated LLR values, did not converge to a sufficient reliability to pass all parity checks at each check node.

To provide for greater computational speed and efficiency, the error-handling module 113 described herein can be configured to monitor the updated LLR values of the bits of the codeword during the iterative soft decoding process to determine if the soft decoding process is able to decode the embedded data before the iteration counter achieves the predefined maximum iteration count. If the error-handling module 113 determines that the soft decoding process using a given LLR set (e.g., the LLR set in Table 1) will be unable to decode the embedded data before the iteration counter achieves the predefined maximum iteration count, the error-handling module 113 can terminate the soft decoding process before the iteration count reaches the predefined maximum iteration count. The error-handling module 113 can then switch to a next soft decoding process using a different LLR set (e.g., the LLR set in Table 2) sooner than if the iteration count reached the predefined maximum. Accordingly, the error-handling module 113 described herein can provide for more efficient decoding by being able to more rapidly determine failure of a given soft decoding process before switching to another potentially more effective soft decoding process.

As an example, the error-handling module 113 can implement predefined iterative decoding parameters to monitor the iterative soft decoding process to provide for early termination (e.g., before the predefined maximum iteration count) of a given soft decoding process. For example, the predefined iterative decoding parameters can include a minimum iteration threshold that can define an initial quantity of iterations of the soft decoding process before the error-handling module 113 begins monitoring the updated LLR values. As an example, upon initiation of a soft decoding process, it may take several iterations before the updated LLR values begin to converge or diverge in a manner that is indicative of a probability of success. Therefore, after the iteration counter has an iteration count greater than the number of iterations defined by the minimum iteration threshold, the error-handling module 113 can begin monitoring the updated LLR values of the bits to determine if the soft decoding process will be successful before the predefined maximum iteration count.

The predefined iterative decoding parameters can also include an updated LLR value threshold and an unreliable bit population threshold. The updated LLR value threshold can define a threshold of updated LLR values that signify a relatively low reliability for purposes of the monitoring, and the unreliable bit population threshold can define a threshold of bits having updated LLR values within the updated LLR value threshold. As an example, at each iteration (e.g., after the minimum iteration threshold), the error-handling module 113 can determine how many of the bits of the codeword have an updated LLR value (e.g., absolute value) that is within the updated LLR value threshold, and are thus unreliable bits. The error-handling module 113 can then determine if the number of unreliable bits of the codeword is greater than the unreliable bit population threshold. If the number of unreliable bits of the codeword is greater than the unreliable bit population threshold, then the error-handling module 113 can terminate the soft decoding process.

The predefined iterative decoding parameters can further include at least one occurrence count threshold. The occurrence count threshold(s) can correspond to additional conditions regarding the determination of whether the error-handling module 113 terminates the soft decoding process based on the number of unreliable bits of the codeword relative to the unreliable bit population threshold. Examples of occurrence count threshold(s) can relate to a number of occurrences of the number of unreliable bits of the codeword relative to the unreliable bit population threshold. Therefore, the occurrence count threshold(s) can provide for an ability to adjust the conditions under which the error-handling module 113 terminates the soft decoding process.

In examples where the codeword is successfully corrected by the decoding operation of the error-handling module 113, the corrected codeword is stored in the local memory 119. Additionally, in some examples, the memory sub-system controller 115 can extract embedded data (e.g., remove parity bits) from the corrected codeword, and output the embedded data to the host system 120, such as in a return operation in response to a read memory request provided by the host system 120. In other examples, the entire codeword (including the parity bits) is output to the host system 120.

Figure 1B:
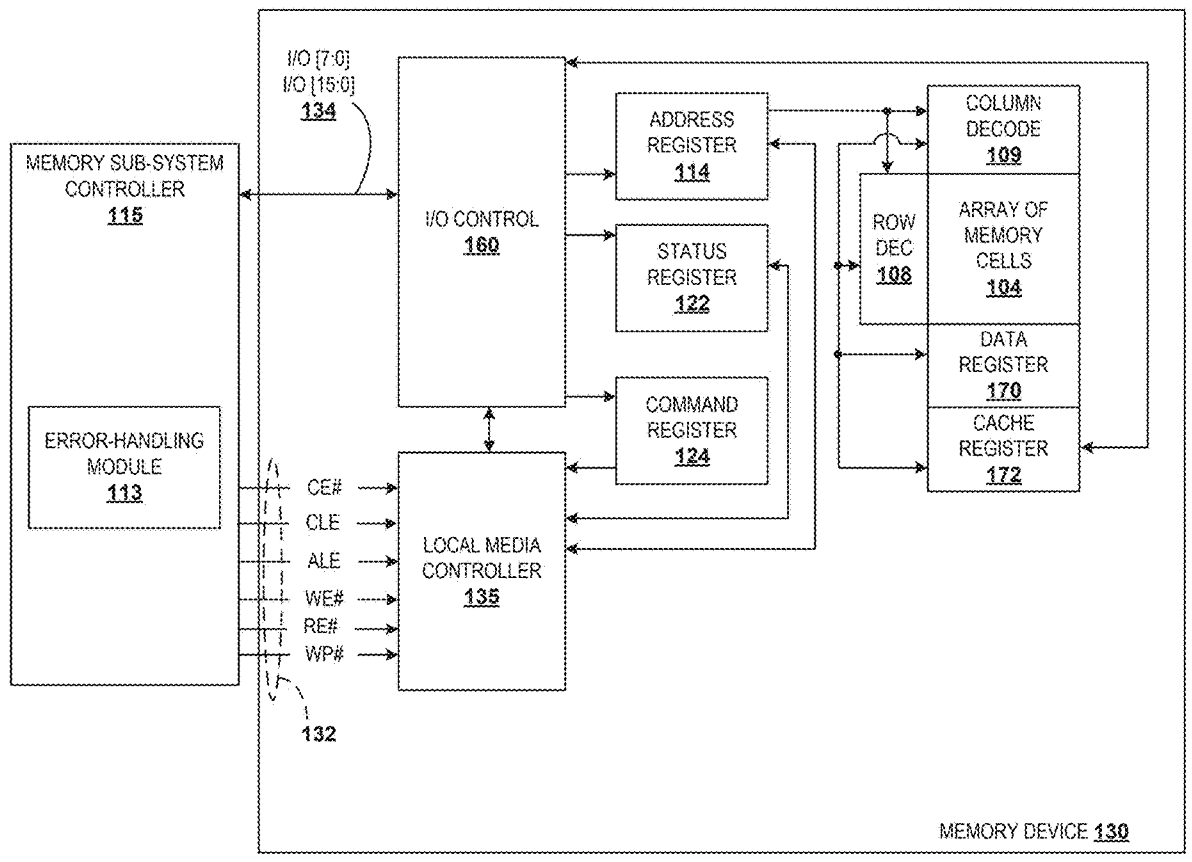
FIG. 1B illustrates a simplified block diagram of an example memory device in communication with a memory sub-system controller.

FIG. 1B illustrates a simplified block diagram of an example of a first apparatus, in the form of a memory device 130, in communication with an example of a second apparatus, in the form of a memory sub-system controller 115 of a memory sub-system (e.g., the memory sub-system 110 of FIG. 1A). Some examples of electronic systems include personal computers, personal digital assistants (PDAs), digital cameras, digital media players, digital recorders, games, appliances, vehicles, wireless devices, mobile telephones, etc. The memory sub-system controller 115 (e.g., a controller external to the memory device 130), can be a memory controller or other external host device.

The memory device 130 includes an array of memory cells 104 logically arranged in rows and columns. The memory cells 104 form a non-transitory computer-readable medium. Memory cells of a logical row are connected to the same access line (e.g., a wordline) while memory cells of a logical column are selectively connected to the same data line (e.g., a bit line) in some examples. In some examples, a single access line is associated with more than one logical row of memory cells and a single data line may be associated with more than one logical column. Memory cells (not shown in FIG. 1B) of at least a portion of the array of memory cells 104 are capable of being programmed to one of at least two target data states.

The memory device 130 includes row decode circuitry 108 and column decode circuitry 109 for decoding address signals. Address signals are received and decoded to access an array of memory cells 104 of the memory device 130. The memory device 130 also includes input/output (I/O) control circuitry 160 to manage input of commands, addresses and data to the memory device 130 as well as output of data and status information from the memory device 130. The memory device 130 has an address register 114 and is in communication with the I/O control circuitry 160, the row decode circuitry 108 and the column decode circuitry 109 to latch the address signals prior to decoding. The memory device 130 also includes a command register 124 in communication with the I/O control circuitry 160 and a local media controller 135 (e.g., the local media controller 135 of FIG. 1A) to latch incoming commands.

A controller (e.g., the local media controller 135 internal to the memory device 130) controls access to the array of memory cells 104 in response to the commands and generates status information for the external memory sub-system controller 115. For example, the local media controller 135 is configured to perform access operations (e.g., read operations, programming operations and/or erase operations) on the array of memory cells 104. The local media controller 135 is in communication with the row decode circuitry 108 and the column decode circuitry 109 to control the row decode circuitry 108 and the column decode circuitry 109 in response to the addresses.

As described above in the example of FIG. 1A, the error-handling module 113 can implement soft decoding processes to decode codewords corresponding to the data stored in the memory device 130 (e.g., the array of memory cells 104). As described herein, the error handling module 113 can first attempt to decode a codeword with a first soft decoding process (e.g., standard LDPC decoding process). In response to failure of the first soft decoding process to decode the codeword, the error-handling module 113 can switch to a second soft decoding process to decode the codeword. To save computational time, as described herein, the decoder can detect if the first soft decoding process will be unable to decode the codeword before the maximum iteration count based on the reliability values of the bits of the codeword before switching to the second soft decoding process, and can thus terminate the first soft decoding process before the iteration counter reaches the maximum iteration count. The error-handling module 113 can thus begin the second soft decoding process sooner than a decoder that achieves the maximum iteration count before switching to a different decoding scheme.

The local media controller 135 is also in communication with a cache register 172. The cache register 172 latches data, either incoming or outgoing, as directed by the local media controller 135 to temporarily store data while the array of memory cells 104 is busy writing or reading, respectively, other data. During a program operation (e.g., write operation), data is passable from the cache register 172 to the data register 170 for transfer to the array of memory cells 104, and new data can be latched in the cache register 172 from the I/O control circuitry 160. During a read operation, data is passable from the cache register 172 to the I/O control circuitry 160 for output to the memory sub-system controller 115. New data is passable from the data register 170 to the cache register 172. The cache register 172 and/or the data register 170 form (e.g., or form a portion of) a page buffer of the memory device 130. The page buffer includes sensing devices (not shown in FIG. 1B) to sense a data state of a memory cell of the array of memory cells 104. For example, the sensing devices sense a state of a data line connected to that memory cell. The memory device 130 also includes a status register 122 in communication with the I/O control circuitry 160 and the local media controller 135 to latch the status information for output to the memory sub-system controller 115.

The memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE # and/or a write protect signal WP #. Additional or alternative control signals (not shown) can be further received over control link 132 depending upon the nature of the memory device 130. In some examples, the memory device 130 receives command signals (which represent commands), address signals (which represent addresses) and data signals (which represent data) from the memory sub-system controller 115 over a multiplexed input/output (I/O) bus 134 and outputs data to the memory sub-system controller 115 over the I/O bus 134.

In some examples, the commands are received over input/output (I/O) pins [7:0] of the I/O bus 134 at I/O control circuitry 160 and may then be written into the command register 124. The addresses are received over input/output (I/O) pins [7:0] of the I/O bus 134 at I/O control circuitry 160 and written into the address register 114. The data is receivable over input/output (I/O) pins [7:0] for an 8-bit device or input/output (I/O) pins [15:0] for a 16-bit device at I/O control circuitry 160 and is writable into the cache register 172. The data is subsequently written into the data register 170 for programming the array of memory cells 104 in some examples.

In some examples, the cache register 172 is omitted, and in such examples, the data is written directly into the data register 170. Additionally or alternatively, data is output over input/output (I/O) pins [7:0] for an 8-bit device or input/output (I/O) pins [15:0] for a 16-bit device. Moreover, it is noted that although reference is made to I/O pins, in other examples, a different conductive node providing for electrical connection to the memory device 130 by an external device (e.g., the memory sub-system controller 115), such as conductive pads or conductive bumps could be used in addition to or as a replacement for the I/O pins.

The example memory device 130 of FIG. 1B has been simplified. Moreover, in other examples, the functionality of the various block components described with reference to FIG. 1B are not segregated to distinct components or component portions of an integrated circuit device. For example, a single component or component portion of an integrated circuit device could be adapted to perform the functionality of more than one block component of FIG. 1B. Alternatively, components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) are useable in various examples.

Figure 2:
FIG. 2 illustrates an example diagram of a set of iterative decoding parameters.
Figure 2:
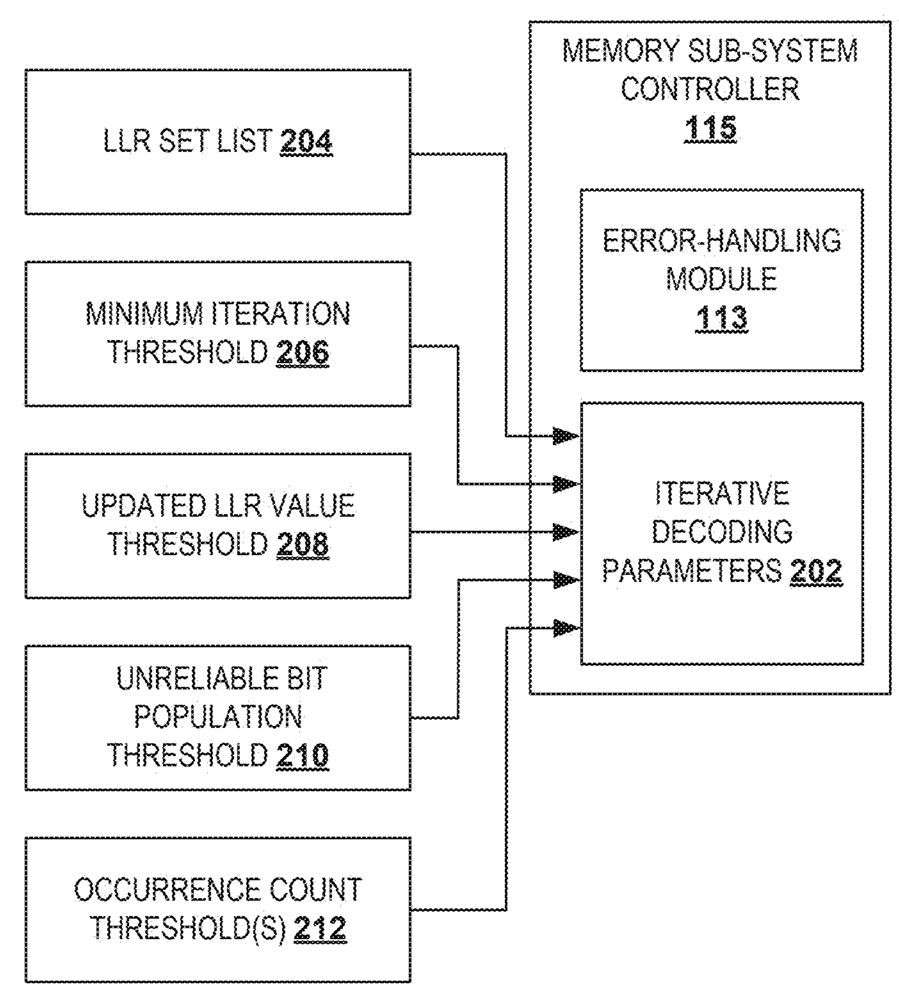

FIG. 2 illustrates an example diagram 200 of a set of iterative decoding parameters. The diagram 200 demonstrates the memory sub-system controller 115 and the error-handling module 113 therein. Additionally, the memory sub-system controller 115 includes iterative decoding parameters 202 that can be programmed to set the conditions of the iterative soft decoding process for providing purposes of terminating the soft decoding process prior to the iteration count achieving the predefined maximum.

The iterative decoding parameters 202 can be stored in the local memory 119, or can be accessed from another memory device. As an example, the iterative decoding parameters 202 can be programmed and/or provided to the memory sub-system controller 115 via user inputs and/or an external device. During a soft decoding process, the error-handling module 113 can access the iterative decoding parameters 202 to perform the soft decoding process, as well as to determine if and/or when to terminate the soft decoding process before the iteration count achieves the maximum iteration count.

In the example of FIG. 2, the iterative decoding parameters 202 include an LLR set list 204 that can define the LLR values of each of the LLR sets implemented by the respective soft decoding processes. For example, the LLR set list 204 can include a first LLR set having first LLR values (e.g., as described in Table 1) that can be implemented in a first soft decoding process, and a second LLR set having second LLR values (e.g., as described in Table 2) that can be implemented in a second soft decoding process in response to failure of the first soft decoding process. The LLR sets in the LLR set list 204 can thus have different LLR values to provide different likelihoods of success of decoding the codeword, such as based on different HRER values. As an example, the LLR sets in the LLR set list 204 can be arranged in order from a first LLR set that has a greatest likelihood of success on a broadest population of codewords (e.g., having an average HRER) to a last LLR set that has a least likely likelihood of success on the average codeword, but can be optimized for higher values of HRER.

The predefined iterative decoding parameters 202 can also include a minimum iteration threshold 206. The minimum iteration threshold 206 can define an initial quantity of iterations of the soft decoding process before the error-handling module 113 begins monitoring the updated LLR values to determine if/when early termination of the soft decoding process is possible. As an example, upon initiation of a soft decoding process, it may take many iterations before the updated LLR values begin to converge or diverge in a manner that is indicative of a probability of success of the soft decoding process. Therefore, after the iteration counter has an iteration count greater than the number of iterations defined by the minimum iteration threshold 206, the error-handling module 113 can begin monitoring the updated LLR values of the bits to determine if the soft decoding process will be successful before the predefined maximum iteration count.

The predefined iterative decoding parameters can also include an updated LLR value threshold 208 and an unreliable bit population threshold 210. The updated LLR value threshold 208 can define a threshold of updated LLR values that signify a relatively low reliability for purposes of the determining if/when to early terminate the soft decoding process. As an example, at each iteration (e.g., after the iteration count defined by the minimum iteration threshold 206), the error-handling module 113 can determine how many of the bits of the codeword have an updated LLR value (e.g., absolute value) that is within the LLR value defined by the updated LLR value threshold 208, and can thus be considered unreliable bits. For purposes of determining if/when to early terminate the soft decoding process, the updated LLR value threshold 208 cooperates with the unreliable bit population threshold 210.

The unreliable bit population threshold 210 can define a threshold of bits of the codeword having updated LLR values within the LLR value defined by the updated LLR value threshold 208. The error-handling module 113 can thus determine, in each iteration of the soft decoding process after the iteration count defined by the minimum iteration threshold 206, if the number of unreliable bits of the codeword, as defined by the updated LLR value threshold 208, is greater than the quantity of bits of the codeword defined by the unreliable bit population threshold 210. If the number of unreliable bits of the codeword is greater than the unreliable bit population threshold 210 at an iteration prior to the maximum iteration count, then the error-handling module 113 can terminate the soft decoding process. As a first example, the termination of the soft decoding process can occur in response to the instance of the number of unreliable bits of the codeword being greater than the unreliable bit population threshold 210. As a second example, the determination of whether to terminate the soft decoding process can be subject to additional conditions.

The predefined iterative decoding parameters can further include at least one occurrence count threshold 212. The occurrence count threshold(s) 212 can define additional conditions regarding the determination of whether the error-handling module 113 terminates the soft decoding process in response to the number of unreliable bits of the codeword being greater than the unreliable bit population threshold 210. The occurrence count threshold(s) 212 can each relate to a number of occurrences of the number of unreliable bits of the codeword being greater than the unreliable bit population threshold 210.

As a first example, the occurrence count threshold(s) 212 can include a first predefined quantity of iterations of the soft decoding process of occurrences in which the quantity of unreliable bits of the codeword defined by the updated LLR value threshold 208 is greater than the quantity of bits defined by the unreliable bit population threshold 210 before the iteration counter achieves the maximum iteration count. Therefore, if the number of unreliable bits is greater than the unreliable bit population threshold 210 in each of a number of iterations of the first predefined quantity of iterations defined by the occurrence count threshold(s) 212 before the maximum iteration count, the error-handling module 113 can terminate the soft decoding process. For example, if the first predefined quantity of iterations defined by the occurrence count threshold(s) 212 is three iterations, then the error-handling module 113, after completion of a number of iterations of the soft decoding process greater than the minimum iteration threshold 206, can count a number of occurrences of the number of unreliable bits being greater than the unreliable bit population threshold 210. On the third occurrence of the number of unreliable bits being greater than the unreliable bit population threshold 210, the error-handling module 113 can terminate the soft decoding process.

As a second example, the occurrence count threshold(s) 212 can include a second predefined quantity of iterations of the soft decoding process of occurrences in which the quantity of unreliable bits of the codeword defined by the updated LLR value threshold 208 is greater than the quantity of bits defined by the unreliable bit population threshold 210 within a predefined iteration count range. The predefined iteration count can also be defined by the condition count threshold(s) 212. Therefore, if the number of unreliable bits is greater than the unreliable bit population threshold 210 in each of a number of iterations of the second predefined quantity of iterations defined by the occurrence count threshold(s) 212 within the predefined iteration count range, the error-handling module 113 can terminate the soft decoding process.

For example, in the second example of the occurrence count threshold(s) 212, the second predefined quantity of iterations can be defined as three iterations, and the predefined iteration count range can be defined as five iterations. Therefore, after completion of a number of iterations of the soft decoding process greater than the minimum iteration threshold 206, in response to a first occurrence of the number of unreliable bits being greater than the unreliable bit population threshold 210 on a given iteration, the error-handling module 113 can count a number of additional occurrences of the number of unreliable bits being greater than the unreliable bit population threshold 210 in the next four iterations (for a total of five iterations of the iteration count range). If the error-handling module 113 counts two additional occurrences of the number of unreliable bits being greater than the unreliable bit population threshold 210 (for a total of three occurrences of the second predefined quantity of iterations) within the next four iterations, the error-handling module 113 can terminate the soft decoding process.

As a third example, the occurrence count threshold(s) 212 can include a third predefined quantity of consecutive iterations of the soft decoding process of occurrences in which the quantity of unreliable bits of the codeword defined by the updated LLR value threshold 208 is greater than the quantity of bits defined by the unreliable bit population threshold 210. Therefore, if the number of unreliable bits is greater than the unreliable bit population threshold 210 in each of a number of consecutive iterations equal to the third predefined quantity of consecutive iterations defined by the occurrence count threshold(s) 212, the error-handling module 113 can terminate the soft decoding process.

For example, in the third example of the occurrence count threshold(s) 212, the third predefined quantity of consecutive iterations can be defined as three iterations. Therefore, after completion of a number of iterations of the soft decoding process greater than the minimum iteration threshold 206, in response to a first occurrence of the number of unreliable bits being greater than the unreliable bit population threshold 210 on a given iteration, the error-handling module 113 can count a number of additional consecutive occurrences of the number of unreliable bits being greater than the unreliable bit population threshold 210. If the error-handling module 113 counts two additional consecutive occurrences of the number of unreliable bits being greater than the unreliable bit population threshold 210 (for a total of three consecutive occurrences of the third predefined quantity of consecutive iterations), the error-handling module 113 can terminate the soft decoding process.

The occurrence count threshold(s) 212 the occurrence count threshold(s) 212 described above are not limited to being mutually exclusive, and can thus be combined in any of a variety of ways to define the conditions at which the error-handling module 113 terminates the soft decoding process early. Additionally, are not limited to the examples above, and can include other occurrence count thresholds or other conditions for early termination of the soft decoding process. Accordingly, the error-handling module 113 can terminate the soft decoding process early, as described herein, for a variety of different other reasons.

Figure 3:
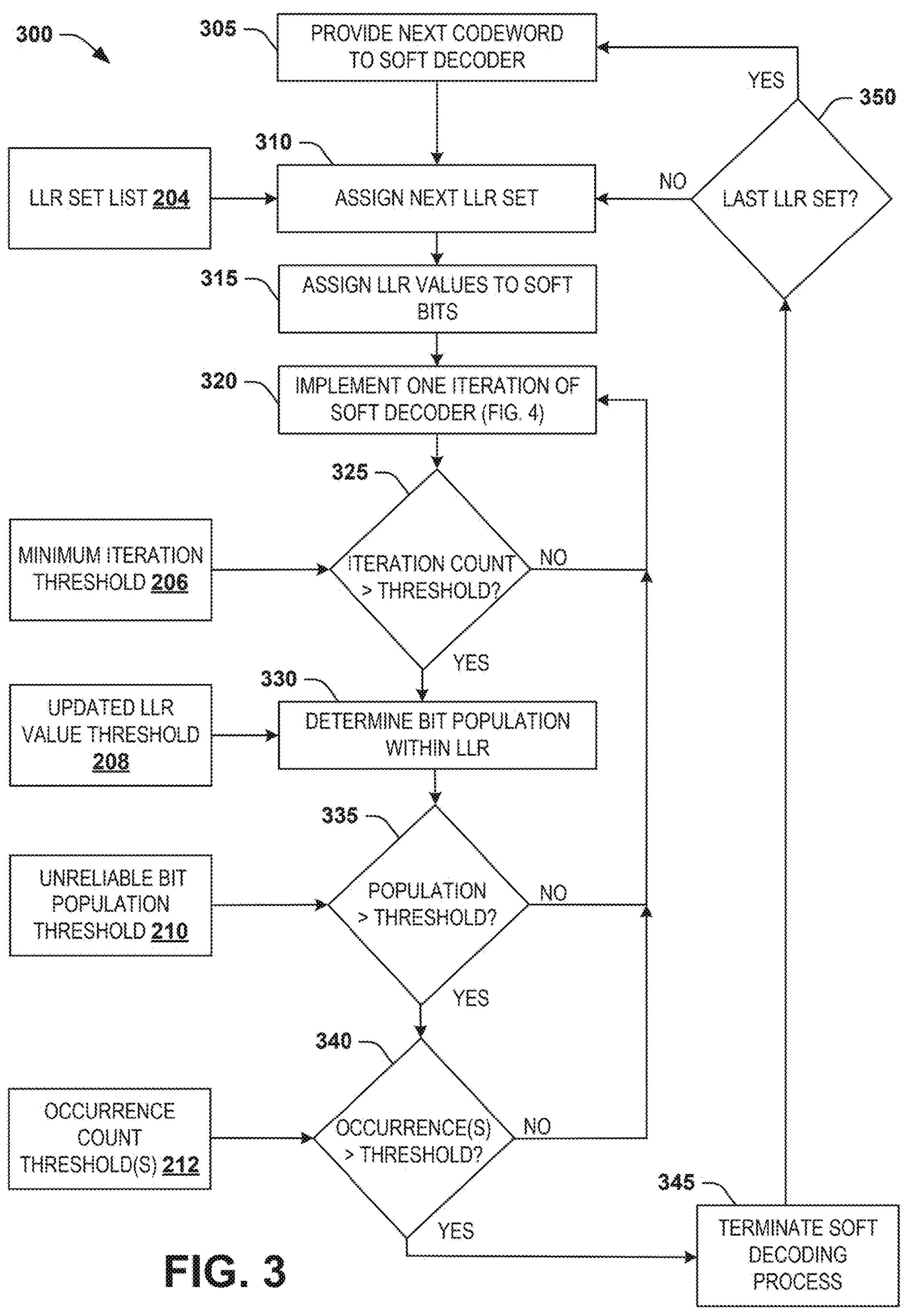
FIG. 3 illustrates a flowchart of an example method for decoding data via a soft decoding process.

FIG. 3 illustrates a flowchart of an example method 300 for decoding data via a soft decoding process. The method 300 can be implemented, for example, by a controller, such as the memory sub-system controller 115 of the system 100 of FIG. 1A. The method 300 can thus correspond to any type of soft decoding process, such as a standard LDPC decoding process or a soft RAIN LDPC decoding process. At block 305 the controller retrieves a next codeword that includes both data and parity bits. The next codeword can correspond to a next codeword in a sequence of codewords and is typically output from a communication channel or retrieved from a storage device, where the codeword has been previously encoded with a soft decoding scheme (e.g., LDPC) that includes parity bits for error detection and correction. The bits of the codeword have a reliability (e.g., low, medium or high).

At block 310, the error-handling module assigns a next LLR set from the LLR set list 204 to the codeword. If the method 300 arrives at block 310 from block 305, the next LLR set that is assigned to the codeword can be the first LLR set of the LLR set list 204. At 315, the error-handling module assigns LLR values from an LLR set to each bit of the codeword to provide a codeword LLR. The LLR set can be formed of integers corresponding to reliability of bits in the codeword (e.g., as demonstrated in Table 1). The method then proceeds to 320, at which the error-handling module implements one iteration of the soft decoding process. As an example, the error-handling module initiates an error correction operation using a soft decoding algorithm (e.g., that employs a MinSum decoder), and the codeword LLR assigned at block 315 is employed as an initiation parameter of the soft decoding process. The single iteration of the soft decoding process is described in the example of FIG. 4. After the single iteration of the soft decoding process described in the example of FIG. 4, the method 300 proceeds to block 325.

Figure 4:
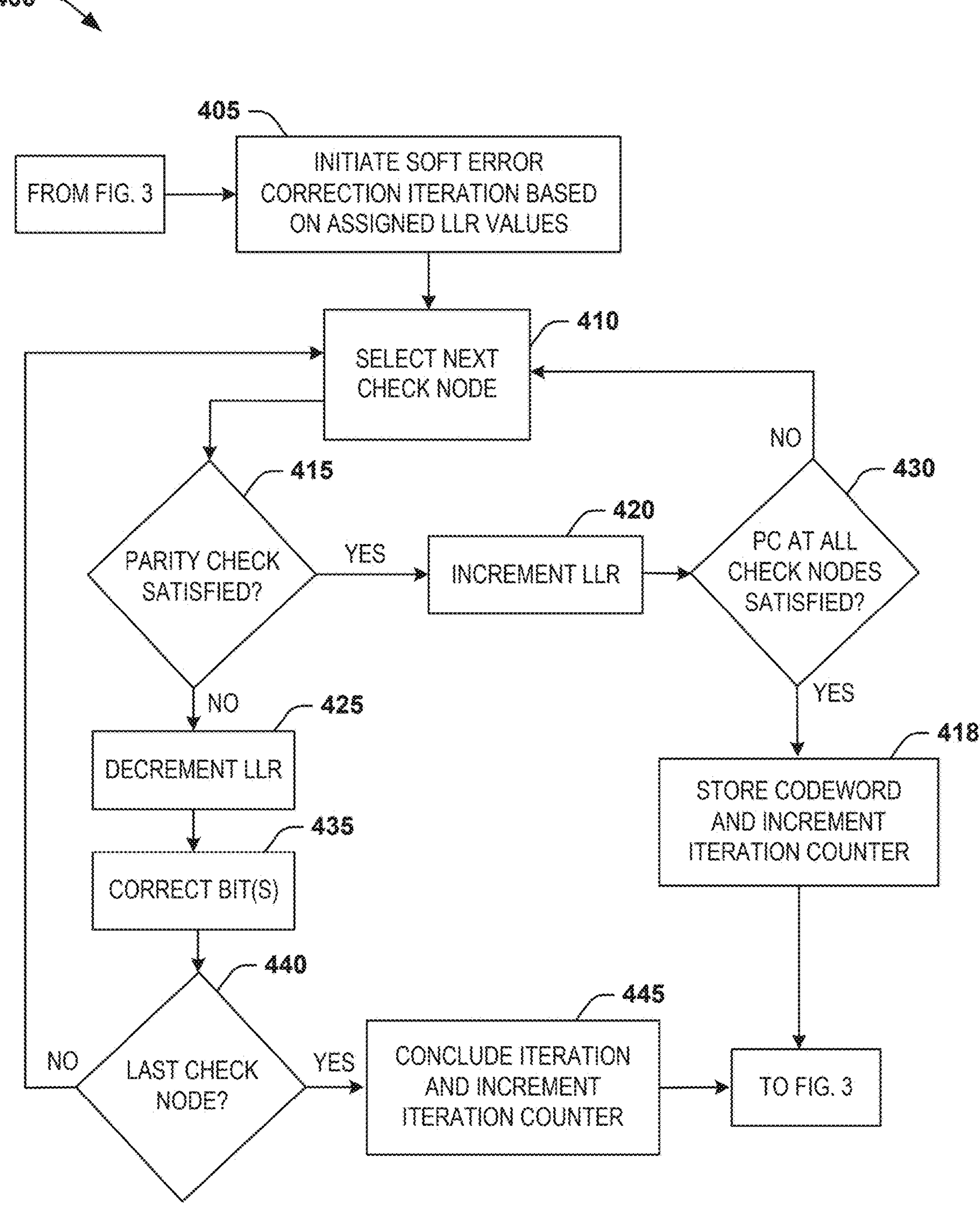
FIG. 4 illustrates a flowchart of an example method for an iteration of a soft decoding process.

FIG. 4 illustrates a flowchart of an example method 400 for an iteration of a soft decoding process. The method 400 can be implemented, for example, by a controller, such as the memory sub-system controller 115 of the system 100 of FIG. 1A. The method 400 can correspond to a single iteration of the soft decoding process, such as a standard LDPC decoding process or a soft RAIN LDPC decoding process. The method 400 begins at block 405, in which the soft decoding process is initiated based on the assigned LLR values from the respective LLR set are assigned at block 315 in the example of FIG. 3.

At block 410, a next check node is selected for a parity check. For example, in implementing a MinSum decoder, the decoding process can calculate two minimum values, min1 and min2 (where min2>min1) for the selected parity check node. In some examples, scalar and offsets are applied to min1 and min2. At block 415, the error-handling module determines whether the parity check of the selected check node is satisfied. If the determination at block 415 is positive (e.g., YES), the method 400 proceeds to block 420. If the determination at block 415 is negative (e.g., NO), the method 400 proceeds to block 425.

At block 420 (reached if the parity check at block 415 for the selected node is satisfied), the LLR value for each variable node connected to the selected check node is incremented (rewarded) by the error correcting module. For example, the LDPC decoding process can increment the variable node with a lowest LLR value by min2, and can increment the remaining variable node(s) by min1. At block 430, the error-handling module determines whether the parity check (PC) of all check nodes is satisfied. If the determination at block 430 is positive (e.g., YES), then no errors remain in the codeword, and the method 400 proceeds to block 418. If the determination at block 430 is negative (e.g., NO), the method 400 proceeds to block 410. At block 410, a next check node is selected by the error-handling module and the method 400 returns to block 415.

At block 418 (reached if the parity check of all check nodes is satisfied), the codeword is stored in a local memory (e.g., the local memory 119) of the controller. The data extracted from the codeword can be output to an external system, such as a host (e.g., the host system 120 of FIG. 1A). For instance, in some such examples, in response to detecting that no errors are present in the codeword, the parity bits are removed from the codeword, and the remaining data is provided to the external system, such as in a return operation in response to a read memory request. The single iteration of the soft decoding process of method 400 then concludes in block 418. The iteration counter is incremented in block 418, and the method 400 proceeds to block 325 in the example of FIG. 3.

At block 425 (reached if the parity check at block 415 for the selected check node fails), the error correcting module decrements (penalizes) the LLR value for each variable node connected to the selected check node. The decoding process can decrement the variable node with a lowest LLR value by min2, and can decrement the remaining variable node(s) by min1. At block 435, the bit(s) of the variable node are flipped if the decrementing of the LLR value at block 425 changes a sign of bit(s) at a variable node. The method 400 then proceeds to block 440.

At block 440, the error-handling module determines whether the parity check provided at block 415 was provided on the last check node of the current iteration of the soft decoding process. If the determination at block 440 is positive (e.g., YES), the method 400 proceeds to block 445. If the determination at block 440 is negative (e.g., NO), the method 400 returns to block 410, at which a next check node is selected by the error-handling module and the method 400 proceeds to a parity check of the next check node at block 415. If the determination at block 440 is positive (e.g., YES), the single iteration of the soft decoding process of method 400 then concludes. The iteration counter is incremented and the method 400 proceeds to block 325 in the example of FIG. 3.

Referring back to the example of FIG. 3, at block 325, after conclusion of the single iteration of the soft decoding process in the example of FIG. 4, a determination is made as to whether the iteration count (e.g., as provided by an iteration counter) of the soft decoding process is greater than the number of iterations defined by the minimum iteration threshold 206. If the determination at block 325 is negative (e.g., NO), the method 300 proceeds back to block 320, and thus back to another single iteration of the soft decoding process in the example of FIG. 4. If the determination at block 325 is positive (e.g., YES), then the method 300 proceeds to block 330.

At block 330, the error-handling module 113 determines the bit population that has updated LLR values (e.g., absolute value) that are within the value defined by the updated LLR value threshold 208. As an example, the error-handling module 113 counts the number of bits in the codeword that have an LLR value, updated in either block 420 (incremented) or block 425 (decremented), that is less than or equal to the LLR value defined by the updated LLR value threshold 208. The error-handling module 113 can thus identify such bits of the codeword as unreliable bits. The method then proceeds to block 335.

At block 335, a determination is made as to whether the number of unreliable bits (e.g., having updated LLR absolute values less than or equal to the updated LLR value threshold 208) is greater than the number of bits defined by the unreliable bit population threshold 210. If the determination at block 335 is negative (e.g., NO), the method 300 proceeds back to block 320, and thus back to another single iteration of the soft decoding process in the example of FIG. 4. If the determination at block 325 is positive (e.g., YES), then the method 300 proceeds to block 340.

At block 340, a determination is made as to whether the error-handling module 113 should terminate the soft decoding process before the maximum iteration count. Particularly, in the example of FIG. 3, the error-handling module 113 can determine if the occurrence of the number of unreliable bits being greater than the number of bits defined by the unreliable bit population threshold 210, as determined in block 335, meets one or more of the thresholds defined by the occurrence count threshold(s) 212 to result in early termination of the soft decoding process. As described above in the example of FIG. 2, the occurrence count threshold(s) 212 can correspond to additional conditions regarding the determination of whether the error-handling module 113 terminates the soft decoding process early based on the number of unreliable bits being greater than the number of bits defined by the unreliable bit population threshold 210, as determined in block 335.

Examples of occurrence count threshold(s) can relate to a number of occurrences of the number of unreliable bits of the codeword relative to the unreliable bit population threshold 210. For example, the error-handling module 113 can evaluate one or more a single iteration of occurrence, a plurality of iterations of occurrence, a plurality of iterations of occurrence in a predefined range of iterations, and/or a plurality of consecutive iterations. If the determination at block 340 is negative (e.g., NO), the method 300 proceeds back to block 320, and thus back to another single iteration of the soft decoding process in the example of FIG. 4. If the determination at block 340 is positive (e.g., YES), then the method 300 proceeds to block 345. At block 345, the error-handling module 113 terminates the decoding process before the iteration count reaches the predefined maximum iteration count. The method 300 then proceeds to block 350.

At block 350, a determination is made as to whether the LLR set assigned at block 315 is the last LLR set of the LLR set list 204. If the determination at block 350 is negative (e.g., NO), the method 300 proceeds back to block 315, at which the error-handling module 113 assigns a next LLR set from the LLR set list 204. The next LLR set can have different LLR values that are assigned to the bits of the codeword at block 320 relative to the previous LLR set for which the soft decoding process was terminated at block 345. For example, the next LLR set can be optimized to provide soft decoding of codewords having a higher range of HRER values.

If the determination at block 350 is positive (e.g., YES), then the method 300 determines that the codeword is uncorrectable. The method then proceeds back to block 305, at which a next codeword of the list of codewords is provided to the soft decoder for a soft decoding process. The method 300 can then attempt to decode the next codeword by assigning the first LLR set of the LLR set list 204 at block 315 to begin another soft decoding process.

The examples of FIGS. 3 and 4 thus describe a manner of providing improved computational speed for a soft decoder that implements multiple soft decoding processes using multiple different LLR sets. By terminating a given soft decoding process at an iteration count before the predefined maximum iteration count, a next soft decoding process with a different LLR set can begin sooner than with a conventional decoder that implements multiple decoding processes with multiple LLR sets or other reliability indicators.

Figure 5:
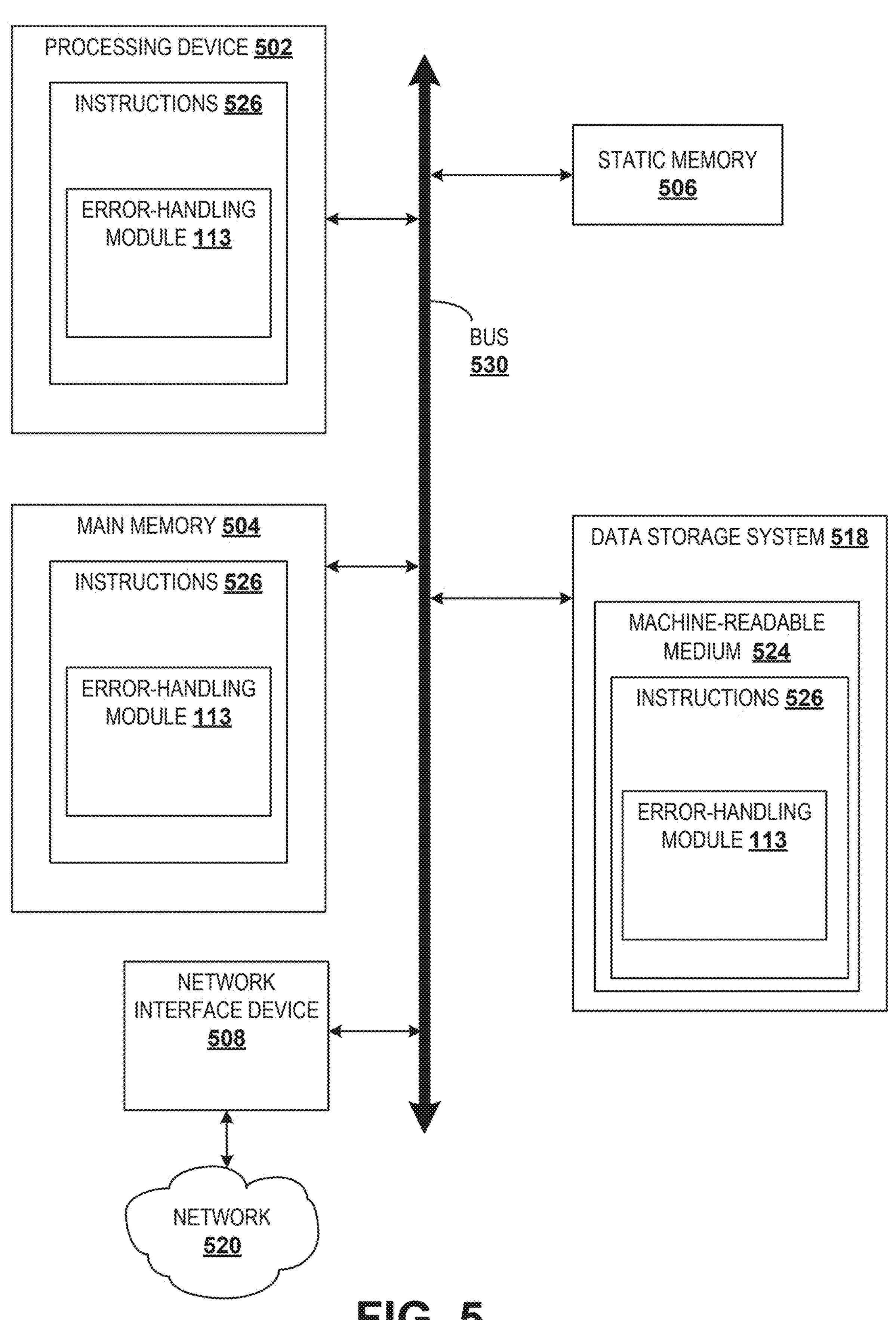
FIG. 5 illustrates an example of a computer system in which examples of the present description may operate.

FIG. 5 illustrates an example machine of a computer system 500 (a machine) within which a set of instructions, for causing the machine to perform any one or more of the methodologies discussed herein, can be executed. In some examples, the computer system 500 corresponds to a host system (e.g., the host system 120 of FIG. 1A) that includes, is coupled to, or utilizes a memory sub-system (e.g., the memory sub-system 110 of FIG. 1A) or is used to perform the operations of a controller (e.g., to execute an operating system to perform operations corresponding to the error-handling module 113 of FIG. 1A). In other examples, the machine is connected (e.g., networked) to other machines in a LAN, an intranet, an extranet and/or the Internet. In various examples, the machine operates in the capacity of a server or a client machine in client-server network environment, as a peer machine in a peer-to-peer (or distributed) network environment or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge or any machine capable of executing a set of instructions (sequential or otherwise) that specify actions to be taken by that machine. In other embodiments, the machine may be a computer within an automotive application, a data center, a smart factory, or other industrial application. Further, while a single machine is illustrated, the term "machine" shall also be taken to include any collection of machines that individually or jointly execute a set (or multiple sets) of instructions to perform the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM) or other non-transitory computer-readable media) and a data storage system 518, which communicate with each other via a bus 530.

The processing device 502 represents one or more general-purpose processing devices such as a microprocessor, a central processing unit, etc. More particularly, the processing device 502 can be a complex instruction set computing (CISC) microprocessor, reduced instruction set computing (RISC) microprocessor, very long instruction word (VLIW) microprocessor or a processor implementing other instruction sets or processors implementing a combination of instruction sets. In some examples, the processing device 502 is implemented with a special-purpose processing devices such as an application specific integrated circuit (ASIC), a field programmable gate array (FPGA), a digital signal processor (DSP), network processor, etc. The processing device 502 is configured to execute instructions 526 for performing the operations discussed herein. In some examples, the computer system 500 includes a network interface device 508 to communicate over the network 520.

The data storage system 518 includes a machine-readable storage medium 524 (also known as a computer-readable medium) that store sets of instructions 526 or software for executing the methodologies and/or functions described herein. The machine-readable storage medium 524 is a non-transitory medium. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518 and/or main memory 504 can correspond to the memory sub-system 110 of FIG. 1A. Accordingly, the machine-readable storage medium 524, the data storage system 518 and/or the main memory 504 are examples of non-transitory computer-readable media.

In some examples, the instructions 526 include instructions to implement functionality corresponding to the error-handling module 113 of FIG. 1A). As an example, the instructions can include implementing multiple soft decoding processes with different respective LLR sets to decode codewords, and can include detecting an inability of a soft decoding process to decode a codeword before a maximum iteration count, and terminating the soft decoding process in response to switch to a next soft decoding process. While the machine-readable storage medium 524 is shown in an example to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared and otherwise manipulated. It has proven convenient at times, principally for reasons of common usage, to refer to these signals as bits, values, elements, symbols, characters, terms, numbers, etc.

It is noted, however, that all of these and similar terms are to be associated with the appropriate physical quantities and are merely convenient labels applied to these quantities. This description can refer to the action and processes of a computer system or similar electronic computing device that manipulates and transforms data represented as physical (electronic) quantities within the computer system's registers and memories into other data similarly represented as physical quantities within the computer system memories or registers or other such information storage systems.

This description also relates to an apparatus for performing the operations herein. This apparatus can be specially constructed for the intended purposes or this apparatus can include a general purpose computer selectively activated or reconfigured by a computer program stored in the computer. Such a computer program can be stored in a computer readable storage medium, such as, but not limited to, any type of disk including floppy disks, optical disks, CD-ROMs, magnetic-optical disks, read-only memories (ROMs), random access memories (RAMs), EPROMs, EEPROMs, magnetic or optical cards or any type of media suitable for storing electronic instructions, each coupled to a computer system bus.

The algorithms and displays presented herein are not inherently related to any particular computer or other apparatus. Various general purpose systems can be used with programs in accordance with the descriptions herein, or it can prove convenient to construct a more specialized apparatus to perform the method. In addition, the present disclosure is not described with reference to any particular programming language. It will be appreciated that a variety of programming languages can be used to implement the teachings of the disclosure as described herein.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications and variations that fall within the scope of this application, including the appended claims. As used herein, the term "includes" means includes but not limited to, the term "including" means including but not limited to. The term "based on" means "based at least in part on". Additionally, where the disclosure or claims recite "a," "an," "a first" or "another" element, or the equivalent thereof, it should be interpreted to include one or more than one such element, neither requiring nor excluding two or more such elements.

What is claimed is:

1. A method for decoding data, comprising:

determining, by an error-handling module of a controller, that a codeword received from a memory device has errors;

initiating a first soft decoding process, by the controller, to decode embedded data from the codeword based on respective log-likelihood ratio (LLR) values of a first LLR set assigned to bits of the codeword, wherein bits identified as having a highest reliability level are assigned first LLR values of a first magnitude and bits identified as having a lowest reliability level are assigned first LLR values of a second magnitude less than the first magnitude and based on updating the first LLR values of the bits at each iteration of the first soft decoding process;

incrementing, by the controller, an iteration counter at each iteration of the first soft decoding process;

determining, by the controller, that the first soft decoding process will be unable to decode the embedded data before the iteration counter achieves a maximum iteration count based on the updated first LLR values of the bits;

terminating the first soft decoding process at an iteration count that is less than the maximum iteration count in response to the determination that the first soft decoding process will be unable to decode the embedded data; and initiating a second soft decoding process to decode the embedded data from the codeword based on respective second LLR values of a second LLR set assigned to the bits of the codeword in response to terminating the first soft decoding process, wherein bits identified as having the highest reliability level are assigned second LLR values of a third magnitude less than the first magnitude and bits identified as having the lowest reliability level are assigned second LLR values of a fourth magnitude greater than the second magnitude.

2. The method of claim 1, wherein determining that the first soft decoding process will be unable to decode the embedded data comprises:

defining a minimum iteration threshold corresponding to a quantity of initial iterations of the first soft decoding process; and determining that the first soft decoding process will be unable to decode the embedded data after the iteration count of the iteration counter is greater than the initial iterations of the minimum iteration threshold and before the iteration counter achieves the maximum iteration count based on the updated LLR values of the bits.

3. The method of claim 1, wherein determining that the first soft decoding process will be unable to decode the embedded data comprises:

defining an updated LLR value threshold;

determining a quantity of bits of the codeword having the respective updated LLR values that are within the updated LLR value threshold; and determining that the first soft decoding process will be unable to decode the embedded data based on the quantity of the bits of the codeword having the respective updated LLR values within the updated LLR value threshold before the iteration counter achieves the maximum iteration count.

4. The method of claim 3, wherein determining that the first soft decoding process will be unable to decode the embedded data further comprises:

defining an unreliable bit population threshold corresponding to a threshold quantity of bits of the codeword having the respective updated LLR values that are within the updated LLR value threshold; and determining if the quantity of bits of the codeword having the respective updated LLR values that that the first soft decoding process will be unable to decode the embedded data based on determining that the quantity of the bits of the codeword having the respective updated LLR values within the updated LLR value threshold exceed the unreliable bit population threshold before the iteration counter achieves the maximum iteration count.

5. The method of claim 3, wherein determining that the first soft decoding process will be unable to decode the embedded data further comprises:

defining at least one occurrence count threshold that defines a respective at least one condition for terminating the first soft decoding process based on the quantity of the bits of the codeword having the respective updated LLR values within the updated LLR value threshold before the iteration counter achieves the maximum iteration count; and determining that the first soft decoding process will be unable to decode the embedded data based on the quantity of the bits of the codeword having the respective updated LLR values within the updated LLR value threshold before the iteration counter achieves the maximum iteration count and based on the iteration count relative to the at least one occurrence count threshold.

6. The method of claim 5, wherein the at least one occurrence count threshold comprises at least one of:

a first predefined quantity of iterations of the first soft decoding process having an occurrence in which the quantity of the bits of the codeword having the respective updated LLR values within the updated LLR value threshold is greater than an unreliable bit population threshold before the iteration counter achieves the maximum iteration count;

a second predefined quantity of iterations of the first soft decoding process having an occurrence in which the quantity of the bits of the codeword having the respective updated LLR values within the updated LLR value threshold is greater than the unreliable bit population threshold within a predefined iteration count range; and a third predefined quantity of consecutive iterations of the first soft decoding having an occurrence in which the quantity of the bits of the codeword having the respective updated LLR values within the updated LLR value threshold is greater than the unreliable bit population threshold.

7. The method of claim 1, wherein the first soft decoding process utilizes a low density parity-check (LDPC) decoding process.

8. The method of claim 1, wherein the first soft decoding process is a soft redundant array of independent NAND (RAIN) low density parity-check (LDPC) decoding process.

9. A system for decoding data, comprising:

a memory device; and a processing device coupled to the memory device, the processing device to perform operations comprising:

determining that a codeword received from the memory device has errors;

initiating a first soft decoding process to decode embedded data from the codeword based on respective log-likelihood ratio (LLR) values of a first LLR set assigned to bits of the codeword, wherein bits identified as having a highest reliability level are assigned first LLR values of a first magnitude and bits identified as having a lowest reliability level are assigned first LLR values of a second magnitude less than the first magnitude and based on updating LLR values of the bits at each iteration of the first soft decoding process;

incrementing an iteration counter at each iteration of the first soft decoding process;

determining that the first soft decoding process will be unable to decode the embedded data before the iteration counter achieves a maximum iteration count based on the updated LLR values of the bits;

terminating the first soft decoding process at an iteration count that is less than the maximum iteration count in response to the determination that the first soft decoding process will be unable to decode the embedded data; and initiating a second soft decoding process to decode the embedded data from the codeword based on respective second LLR values of a second LLR set assigned to the bits of the codeword in response to terminating the first soft decoding process, wherein bits identified as having the highest reliability level are assigned second LLR values of a third magnitude less than the first magnitude and bits identified as having the lowest reliability level are assigned second LLR values of a fourth magnitude greater than the second magnitude.

10. The system of claim 9, wherein determining that the first soft decoding process will be unable to decode the embedded data comprises:

defining a minimum iteration threshold corresponding to a quantity of initial iterations of the soft decoding process; and determining that the first soft decoding process will be unable to decode the embedded data after the iteration count of the iteration counter is greater than the initial iterations of the minimum iteration threshold and before the iteration counter achieves the maximum iteration count based on the updated LLR values of the bits.

11. The system of claim 9, wherein determining that the first soft decoding process will be unable to decode the embedded data comprises:

defining an updated LLR value threshold;

defining an unreliable bit population threshold corresponding to a threshold quantity of bits of the codeword having the respective updated LLR values that are within the updated LLR value threshold;

determining a quantity of bits of the codeword having the respective updated LLR values that are within the updated LLR value threshold; and determining that the first soft decoding process will be unable to decode the embedded data based on the quantity of the bits of the codeword having the respective updated LLR values within the updated LLR value threshold exceed the unreliable bit population threshold before the iteration counter achieves the maximum iteration count.

12. The system of claim 11, wherein determining that the first soft decoding process will be unable to decode the embedded data further comprises:

defining at least one occurrence count threshold that defines a respective at least one condition for terminating the first soft decoding process based on the quantity of the bits of the codeword having the respective updated LLR values within the updated LLR value threshold before the iteration counter achieves the maximum iteration count; and determining that the first soft decoding process will be unable to decode the embedded data based on the quantity of the bits of the codeword having the respective updated LLR values within the updated LLR value threshold before the iteration counter achieves the maximum iteration count and based on the iteration count relative to the at least one occurrence count threshold.

13. A non-transitory computer-readable storage medium comprising instructions that, when executed by a processing device, cause the processing device to perform operations comprising:

determining that a codeword received from a memory device has errors;

initiating a first soft decoding process to decode embedded data from the codeword based on log-likelihood ratio (LLR) values of a first LLR set assigned to bits of the codeword, wherein bits identified as having a highest reliability level are assigned first LLR values of a first magnitude and bits identified as having a lowest reliability level are assigned first LLR values of a second magnitude less than the first magnitude and based on updating LLR values of the bits at each iteration of the first soft decoding process;

incrementing an iteration counter at each iteration of the first soft decoding process;

determining that the first soft decoding process will be unable to decode the embedded data before the iteration counter achieves a maximum iteration count based on the updated LLR values of the bits;

terminating the first soft decoding process at an iteration count that is less than the maximum iteration count in response to the determination that the first soft decoding process will be unable to decode the embedded data; and initiating a second soft decoding process to decode the embedded data from the codeword based on respective second LLR values of a second LLR set assigned to the bits of the codeword in response to terminating the first soft decoding process, wherein bits identified as having the highest reliability level are assigned second LLR values of a third magnitude less than the first magnitude and bits identified as having the lowest reliability level are assigned second LLR values of a fourth magnitude greater than the second magnitude.

14. The medium of claim 13, wherein determining that the first soft decoding process will be unable to decode the embedded data comprises:

defining a minimum iteration threshold corresponding to a quantity of initial iterations of the first soft decoding process; and determining that the first soft decoding process will be unable to decode the embedded data after the iteration count of the iteration counter is greater than the initial iterations of the minimum iteration threshold and before the iteration counter achieves the maximum iteration count based on the updated LLR values of the bits.

15. The medium of claim 13, wherein determining that the first soft decoding process will be unable to decode the embedded data comprises:

defining an updated LLR value threshold;

defining an unreliable bit population threshold corresponding to a threshold quantity of bits of the codeword having the respective updated LLR values that are within the updated LLR value threshold;

determining a quantity of bits of the codeword having the respective updated LLR values that are within the updated LLR value threshold; and determining that the first soft decoding process will be unable to decode the embedded data based on the quantity of the bits of the codeword having the respective updated LLR values within the updated LLR value threshold exceed the unreliable bit population threshold before the iteration counter achieves the maximum iteration count.

16. The medium of claim 15, wherein determining that the first soft decoding process will be unable to decode the embedded data further comprises:

defining at least one occurrence count threshold that defines a respective at least one condition for terminating the first soft decoding process based on the quantity of the bits of the codeword having the respective updated LLR values within the updated LLR value threshold before the iteration counter achieves the maximum iteration count; and determining that the first soft decoding process will be unable to decode the embedded data based on the quantity of the bits of the codeword having the respective updated LLR values within the updated LLR value threshold before the iteration counter achieves the maximum iteration count and based on the iteration count relative to the at least one occurrence count threshold.

* * * * *